United States Patent
Huang et al.

(10) Patent No.: US 7,851,895 B2
(45) Date of Patent: Dec. 14, 2010

(54) SEMICONDUCTOR STRUCTURE AND SEMICONDUCTOR MANUFACTURING METHOD

(75) Inventors: Chih Yi Huang, Kaohsiung (TW); Chih-Wei Wu, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 115 days.

(21) Appl. No.: 12/222,200

(22) Filed: Aug. 5, 2008

(65) Prior Publication Data
US 2009/0039521 A1 Feb. 12, 2009

(30) Foreign Application Priority Data
Aug. 8, 2007 (TW) .............................. 96129150 A

(51) Int. Cl.
*H01L 29/40* (2006.01)
*H01L 23/04* (2006.01)
*H01L 23/12* (2006.01)
*H01L 21/4763* (2006.01)

(52) U.S. Cl. .................. 257/664; 257/698; 257/700; 438/622

(58) Field of Classification Search ............... 257/664, 257/698, 700; 438/622
See application file for complete search history.

(56) References Cited

U.S. PATENT DOCUMENTS

| | | | | |
|---|---|---|---|---|
| 6,441,471 B1 * | 8/2002 | Maetani | ...................... | 257/664 |
| 6,611,419 B1 * | 8/2003 | Chakravorty | ............. | 361/306.3 |
| 6,713,853 B1 * | 3/2004 | Fazelpour et al. | ........... | 257/680 |
| 7,030,480 B2 * | 4/2006 | Kimura et al. | ............... | 257/698 |

* cited by examiner

*Primary Examiner*—Luan C Thai
(74) *Attorney, Agent, or Firm*—Bacon & Thomas, PLLC

(57) ABSTRACT

A semiconductor structure comprising a first signal layer, a second signal layer, a wiring layer and at least one via is provided. The wiring layer is formed between the first signal layer and the second signal layer. A conducting wire is disposed between a first terminal and a second terminal on the wiring layer. At least one via is used to conduct the first signal layer and the second signal layer. The at least one via is disposed adjacent to the first terminal and the second terminal.

20 Claims, 4 Drawing Sheets

SEMICONDUCTOR STRUCTURE AND SEMICONDUCTOR MANUFACTURING METHOD

This application claims the benefit of Taiwan application Serial No. 96129150, filed Aug. 8, 2007, the subject matter of which is incorporated herein by reference.

BACKGROUND OF THE INVENTION

1. Field of the Invention

The invention relates in general to a semiconductor structure, and more particularly to a semiconductor structure with reduced resonance effect and a manufacturing method thereof.

2. Description of the Related Art

As the circuit design is directed towards higher frequencies, the integrity of signals becomes more and more important. For example, two parallel electrical boards can be regarded as a capacitor under the state of direct current (DC), and which can be regarded as a wave guide in the filed of high frequency micro-wave. A wave guide is similar to a resonance cavity. When resonance frequency occurs, the parallel electrical boards transmits the electromagnetic wave of such resonance frequency. In other words, when resonance frequency occurs, part of the to-be-transmitted signal will be transmitted to the parallel electrical boards. Such phenomenon is undesirable during signal transmission, for part of the energy of signal being lost on the parallel electrical boards. Consequently, the energy transmitted from the signal transmission end will not be completely received at the signal reception end, hence resulting in inferior signal quality. From another aspect, if a high frequency noise between the parallel electrical boards should match with the resonance frequency between the parallel electrical boards, such noise will be coupled to the transmission line via the parallel electrical boards. Therefore, the quality of signal transmission is severely affected.

Normally, in a semiconductor structure, the backflow path can be increased by utilizing bypass vias so as to reduce the resonance and coupling effect between parallel electrical boards (such as power layer/ground layer). Particularly, the strip lines in a semiconductor structure are most likely to be affected by the resonance effect between the parallel electrical boards. Therefore, many methods for reducing the resonance effect on the strip lines have been developed in prior art.

Referring to FIG. 1, a structure of several vias disposed along two sides of a strip line is illustrated. As indicated in FIG. 1, to improve the integrity of signal transmission, two rows of vias 12 are disposed beside the strip line 10 in a conventional semiconductor structure, which is the most commonly used method to reduce resonance effect and insertion loss. With the disposition of two rows of vias 12, parallel electrical boards of the same attribution are short-circuited, not only effectively providing a backflow path, but also generating shielding effect to protect the strip line 10 from being affected by the resonance between parallel electrical boards.

However, the above-mentioned method is not a perfect solution for resolving the resonance effect in practice. The strip line 10 is so greatly affected by the resonance between parallel electrical boards that the effect of resonance cannot be completely immunized, even with the two rows of vias 12 beside the strip line 10. Moreover, to reduce resonance effect by way of disposing two rows of vias 12 beside the strip line 10 requires a large number of vias 12 and thus incurs considerable costs. Further, the manner of disposing two rows of vias 12 still remains a certain amount of insertion loss between the parallel electrical boards at a particular frequency, and the resonance effect cannot be resolved effectively. Therefore, how to resolve the problems of resonance effect and insertion loss without incurring too much cost has become an important topic in the development of semiconductor structure.

SUMMARY OF THE INVENTION

The invention is directed to a semiconductor structure and a manufacturing method thereof for reducing the impact of resonance effect on signal transmission.

According to a first aspect of the present invention, a semiconductor structure including a first signal layer, a second signal layer, a wiring layer and at least one via is provided. The wiring layer is formed between the first signal layer and the second signal layer. A conducting wire is disposed between a first terminal and a second terminal on the wiring layer. At least one via is used to conduct the first signal layer and the second signal layer. The at least one via is disposed adjacent to the first terminal and the second terminal.

According to a second aspect of the present invention, a semiconductor manufacturing method is provided. The semiconductor manufacturing method includes the following steps. First, a first signal layer and a second signal layer are formed. Next, a wiring layer is formed between the first signal layer and the second signal layer, and a first terminal and a second terminal are disposed on the wiring layer. Then, a conducting wire is formed between the first terminal and the second terminal on the wiring layer. Further, at least one via is disposed for conducting the first signal layer and the second signal layer. The at least one via is disposed adjacent to the first terminal and the second terminal.

The invention will become apparent from the following detailed description of the preferred but non-limiting embodiment. The following description is made with reference to the accompanying drawings.

DETAILED DESCRIPTION OF THE INVENTION

Figure 1:
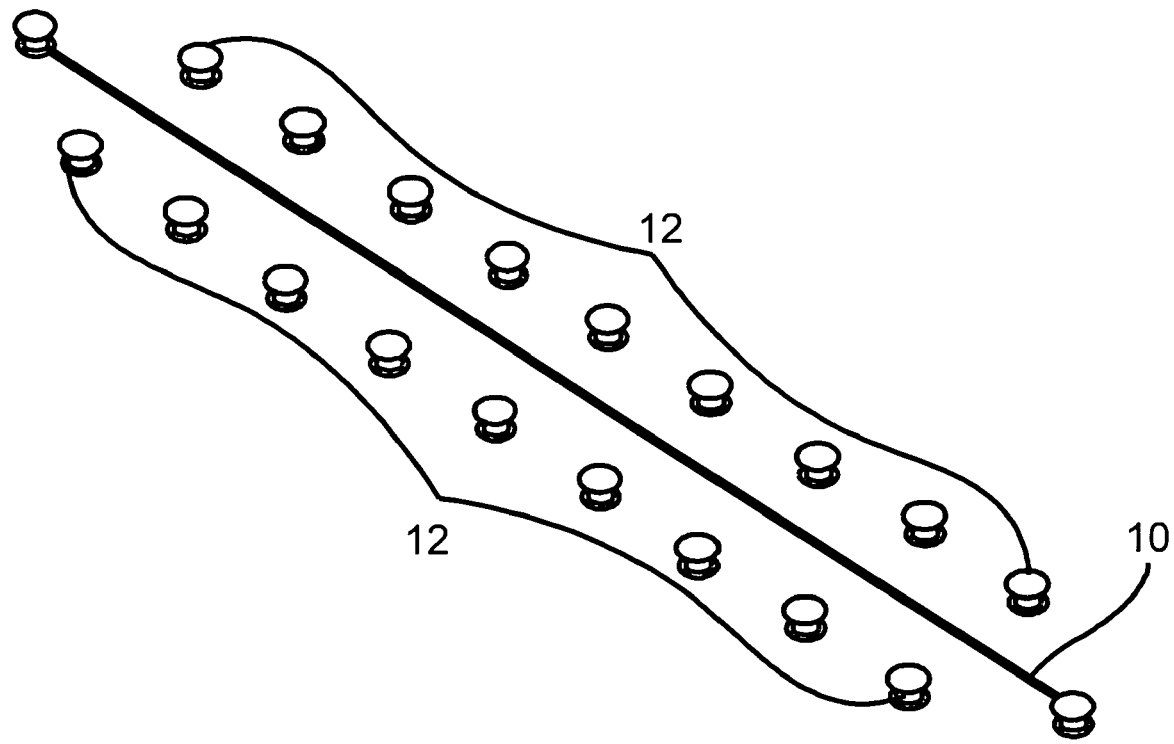
FIG. 1 (prior art) is a structural diagram showing several vias disposed along two sides of a strip line.
Figure 2A:
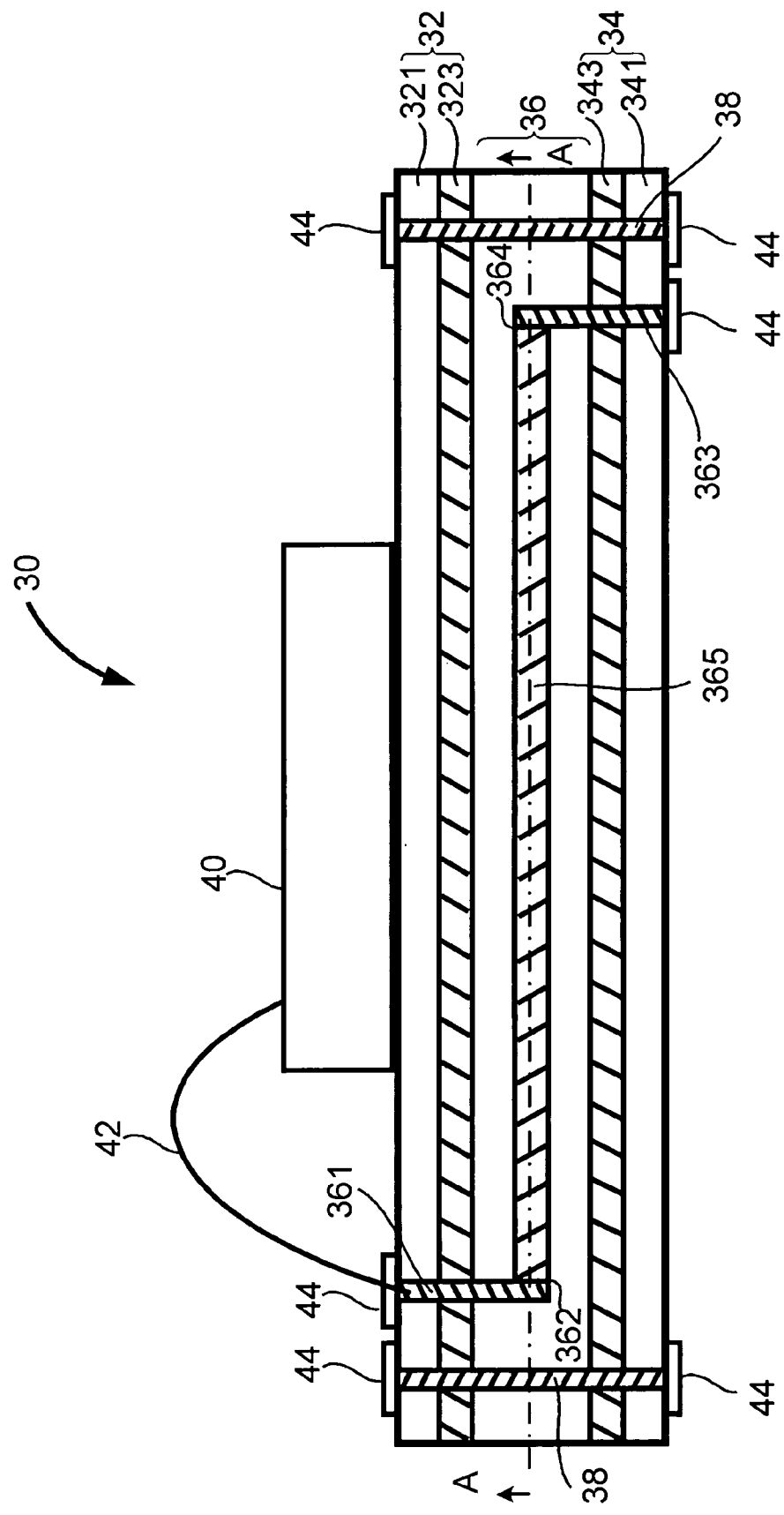
FIG. 2A is a cross-sectional view of a semiconductor structure of the invention.

Referring to FIG. 2A, a cross-sectional view of a semiconductor structure of the invention is shown. As indicated in FIG. 2A, the invention discloses a semiconductor structure 30 including a first signal layer 32, a second signal layer 34, a wiring layer 36 and at least one via 38. The wiring layer 36 is formed between the first signal layer 32 and the second signal layer 34. A conducting wire 36 is formed between a first terminal 362 and a second terminal 364 on the wiring layer 365. At least one via 38 is used to conduct the first signal layer 32 and the second signal layer 34. The at least one via 38 is disposed adjacent to the first terminal 362 and the second terminal 364. In the invention, the nearer to the first terminal 362 and the second terminal 364 the at least one via 38 of the semiconductor structure 30 is, the better the resonance effect is improved. The first signal layer 32 and the second signal layer 34 have the same potential. The wiring layer 36 is a dielectric layer. The conducting wire 365 is a strip line.

The first signal layer 32 includes a first dielectric layer 321 and a first signal circuit 323. The second signal layer 34 includes a second dielectric layer 341 and a second signal circuit 343. The first signal circuit 323 is disposed between the first dielectric layer 321 and the wiring layer 36. The second signal circuit 343 is disposed between the second dielectric layer 341 and the wiring layer 36.

The first terminal 362 and the second terminal 364 respectively have a first pillar 361 and a second pillar 363. The first pillar 361 is disposed between the first signal layer 32 and the wiring layer 36. The second pillar 363 is disposed between the second signal layer 34 and the wiring layer 36. The first pillar 361 and the second pillar 363 transmit signals via the conducting wire 365. Signals are transmitted via the transmission path formed by the first pillar 361, the conducting wire 365 and the second pillar 363. In the present embodiment of the invention, the semiconductor structure 30 of the invention can be connected to a chip 40 via a wire 42. As indicated in FIG. 2A, the chip 40 is connected to the first pillar 361 via the wire 42, and the signal of the chip 40 is transmitted via the transmission path formed by the wire 42, the first pillar 361, the conducting wire 365 and the second pillar 363.

Figure 2B:
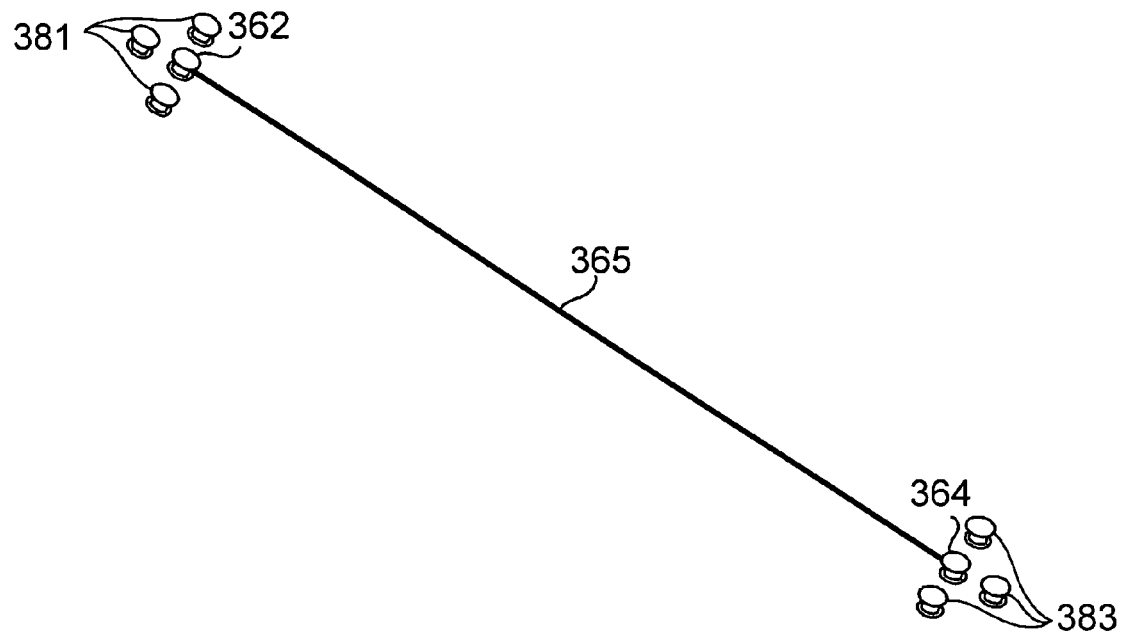
FIG. 2B is a top view of the semiconductor structure of the invention along the cross-sectional line A-A' in FIG. 2A.

Referring to FIGS. 2A and 2B, FIG. 2B is a top view of the semiconductor structure of the invention along the cross-sectional line A-A' in FIG. 2A. As indicated in FIGS. 2A and 2B, the at least one via 38 includes a first group of vias 381 and a second group of vias 383. The first group of vias 381 is symmetrically disposed with respect to the first terminal 362 and the second group of vias 383 is symmetrically disposed with respect to the second terminal 364. In an embodiment of the invention, the first group of vias 381 and the second group of vias 383 respectively include three vias. Besides, the distance between each via in the first group of vias 381 and the first terminal 362 is substantially the same. The distance between each via in the second group of vias 383 and the second terminal 364 is substantially the same.

The at least one via 38 is for short-circuiting the first signal layer 32 and the second signal layer 34). In an embodiment of the invention, each of the at least one via 38 includes a conductive material for short-circuiting the first signal layer 32 and the second signal layer 34, thereby increasing the current backflow path and reducing the resonance effect taking place between the first signal layer 32 and the second signal layer 34. In another embodiment of the invention, each of the at least one via 38 has a pillar for short-circuiting the first signal layer 32 and the second signal layer 34. Besides, the semiconductor structure 30, the at least one via 38, the first pillar 361 and the second pillar 363 of the invention include several finger pads 44 respectively disposed on the surfaces of the first dielectric layer 321 and the second dielectric layer 341 for fixing the at least one via 38, the first pillar 361 and the second pillar 363.

In an embodiment of the invention, the semiconductor structure 30 can be used in a semiconductor package; in another embodiment of the invention, the semiconductor structure 30 can be used in a printed circuit board (PCB).

Figure 3:
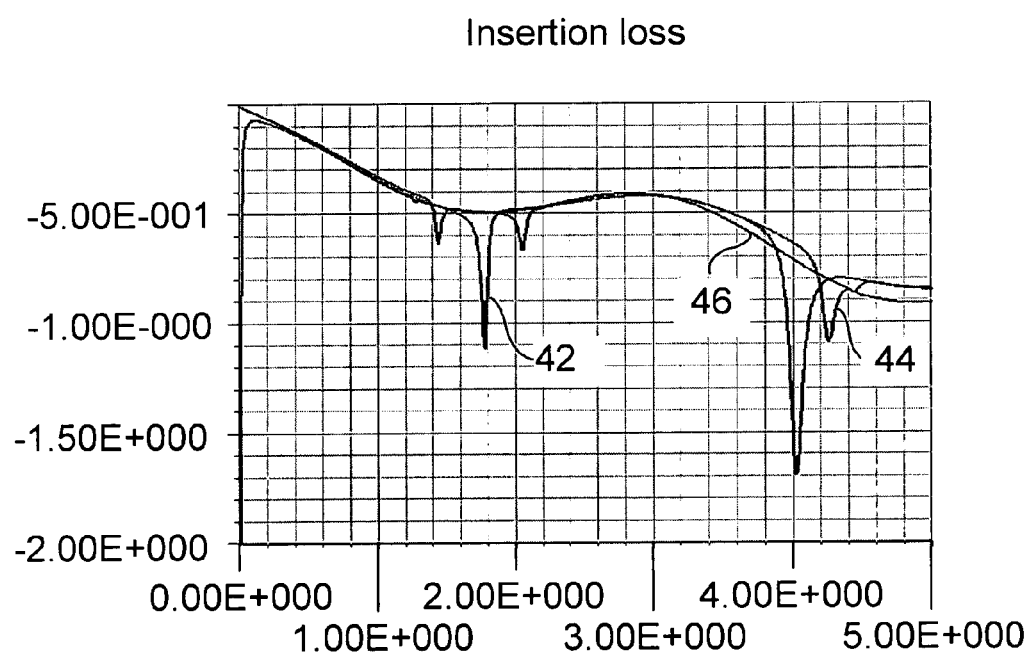
FIG. 3 is a diagram showing the measurement data of insertion loss of the semiconductor structure of the invention that is fluctuating with the frequency.

Referring to FIG. 3, the measurement data of insertion loss of the semiconductor structure of the invention that is fluctuating with the frequency is shown. FIG. 3 illustrates a measurement data curve 42 of a semiconductor structure including a conventional strip line, a measurement data curve 44 of a semiconductor structure with two rows of vias disposed beside the strip line according to the prior art, and a measurement data curve 46 of a semiconductor structure according to the invention. As indicated in FIG. 3, the conventional strip line (curve 42) is greatly affected by the resonance between parallel electrical boards, and has tremendous insertion loss under particular frequencies. If two rows of vias are disposed beside the strip line according to the prior art (curve 44), the resonance effect can be improved but insertion loss will still plummet under some particular frequencies. According to the comparison of the three curves, the resonance effect generated by the semiconductor structure of the invention (curve 46) is almost uncoupled to the conducting wire, that is, the plummeting of insertion loss is absence. Therefore, the semiconductor structure of the invention effectively reduces energy loss of signal transmission to a minimum, hence achieving optimum signal transmission.

Figure 4:
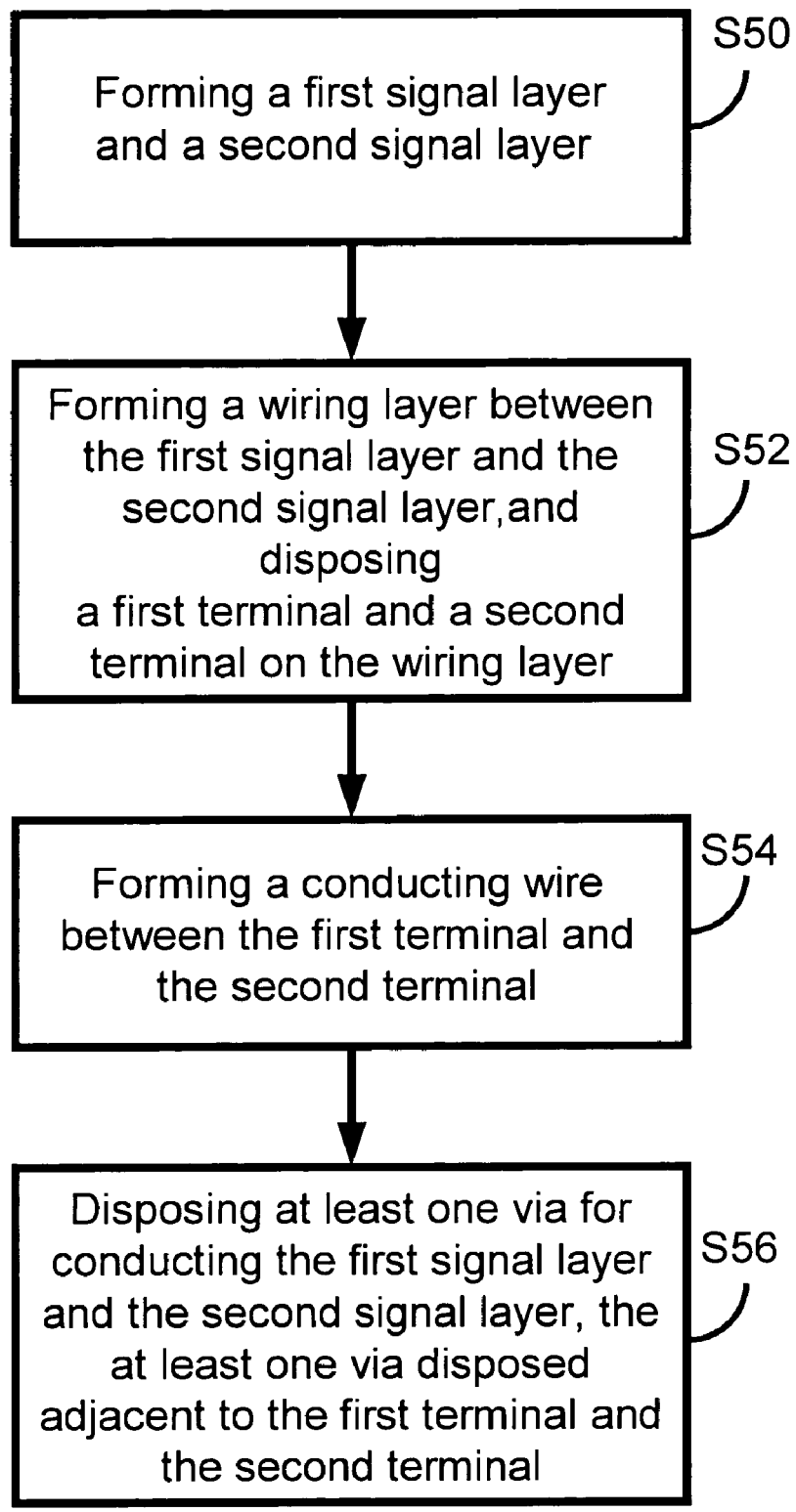
FIG. 4 is a flowchart of a semiconductor manufacturing method of the invention.

Referring to FIG. 4, a flowchart of a semiconductor manufacturing method of the invention is shown. As indicated in FIG. 4, the semiconductor manufacturing method disclosed in another embodiment of the invention includes the following steps.

S50: a first signal layer and a second signal layer are formed. The present step further includes the steps of forming a first dielectric layer and a first signal circuit to constitute the first signal layer and forming a second dielectric layer and a second signal circuit to constitute the second signal layer. The first signal circuit is disposed between the first dielectric layer and the wiring layer, and the second signal circuit is disposed between the second dielectric layer and the wiring layer. In an embodiment of the invention, the first signal layer and the second signal layer have the same potential.

S52: a wiring layer is formed between the first signal layer and the second signal layer. A first terminal and a second terminal are disposed on the wiring layer. The wiring layer is a dielectric layer.

S54: a conducting wire is disposed between the first terminal and the second terminal on the wiring layer. In an embodiment of the invention, the conducting wire is a strip line used for transmitting signals. The present step further includes the step of disposing a first pillar and a second pillar on the first terminal and the second terminal respectively. The first pillar is disposed between the first signal layer and the wiring layer, and the second pillar is disposed between the second signal layer and the wiring layer. The first pillar, the second pillar and the conducting wire disposed therebetween are used for transmitting signals.

S56: at least one via is disposed for conducting the first signal layer and the second signal layer. The at least one via is disposed adjacent to the first terminal and the second terminal.

Each of the at least one via includes a conductive material for short-circuiting the first signal layer and the second signal layer. The at least one via includes a first group of vias and a second group of vias. The first group of vias and the second group of vias are symmetrically disposed with respect to the first terminal and the second terminal respectively. In a preferred embodiment of the invention, the first group of vias and the second group of vias individually include three vias. The distance between each of the three vias in the first group of vias and the first terminal is substantially the same, and the distance between each of the three vias in the second group of vias and the second terminal is substantially the same.

The semiconductor manufacturing method of the invention is used in a package manufacturing process or a printed circuit board (PCB) manufacturing process. However, the application of the semiconductor structure and manufacturing method thereof of the invention is not limited to these two applications. The semiconductor structure and manufacturing method thereof of the invention can be applied in any structures having a strip line disposed between two parallel electrical boards and the manufacturing process thereof for reducing resonance effect. Further, the number of vias is exemplified as three in the invention, but is not limited thereto.

The invention discloses a semiconductor structure and a manufacturing method thereof. The vias are respectively disposed adjacent to two terminals which are symmetric with respect to the strip line. Regardless of the length of the strip line, six vias (three vias disposed beside each of the two terminals) would be sufficient for increasing the integrity of signal transmission and to prevent the plummeting of insertion loss. The signals will not decay due to the resonance mode between signal layers, hence achieving optimum signal integrity. Compared with the conventional way of disposing two rows of vias, the disposition of vias adopted by the semiconductor structure and the manufacturing method thereof of the invention reduces the number of vias and saves related costs. Further, a signal transmission quality that is better than the prior art can be achieved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a first signal layer;
   a second signal layer;
   a wiring layer formed between the first signal layer and the second signal layer, wherein a conducting wire is disposed between a first terminal and a second terminal on the wiring layer; and
   a first group of vias and a second group of vias for conducting the first signal layer and the second signal layer;
   wherein the distance between each via of the first group of vias and the first terminal is substantially the same, and the distance between each via of the second group of vias and the second terminal is substantially the same;
   wherein one of the first group of vias is disposed along the direction of the conducting wire and adjacent to the first terminal and one of the second group of vias is disposed along the direction of the conducting wire and adjacent to the second terminal.

2. The semiconductor structure according to claim 1, wherein the first group of vias is symmetrically disposed with respect to the first terminal, and the second group of vias is symmetrically disposed with respect to the second terminal.

3. The semiconductor structure according to claim 2, wherein the first group of vias and the second group of vias individually comprise at least three vias.

4. The semiconductor structure according to claim 1, wherein the wiring layer is a dielectric layer and the conducting wire is a strip line.

5. The semiconductor structure according to claim 1, wherein the first signal layer comprises a first dielectric layer and a first signal circuit, the second signal layer comprises a second dielectric layer and a second signal circuit, the first signal circuit is disposed between the first dielectric layer and the wiring layer, and the second signal circuit is disposed between the second dielectric layer and the wiring layer.

6. The semiconductor structure according to claim 1, wherein the first signal layer and the second signal layer have the same potential, and the first group of vias and the second group of vias are for short-circuiting the first signal layer and the second signal layer.

7. The semiconductor structure according to claim 6, wherein each of the first group of vias and each of the second group of vias comprises a conductive material for short-circuiting the first signal layer and the second signal layer.

8. The semiconductor structure according to claim 6, wherein each of the first group of vias and each of the second group of vias comprises a pillar for short-circuiting the first signal layer and the second signal layer.

9. The semiconductor structure according to claim 1, wherein the first terminal and the second terminal respectively comprise a first pillar and a second pillar, the first pillar is disposed between the first signal layer and the wiring layer, and the second pillar is disposed between the second signal layer and the wiring layer.

10. A semiconductor manufacturing method, comprising the following steps:
    (A) forming a first signal layer and a second signal layer;
    (B) forming a wiring layer between the first signal layer and the second signal layer, and disposing a first terminal and a second terminal on the wiring layer;
    (C) forming a conducting wire between the first terminal and the second terminal on the wiring layer; and
    (D) disposing a first group of vias and a second group of vias for conducting the first signal layer and the second signal layer;
    wherein the distance between each via of the first group of vias and the first terminal is substantially the same, and the distance between each via of the second group of vias and the second terminal is substantially the same;
    wherein one of the first group of vias is disposed along the direction of the conducting wire and adjacent to the first terminal and one of the second group of vias is disposed along the direction of the conducting wire and adjacent to the second terminal.

11. The semiconductor manufacturing method according to claim 10, wherein the first group of vias is symmetrically disposed with respect to the first terminal, and the second group of vias is symmetrically disposed with respect to the second terminal.

12. The semiconductor manufacturing method according to claim 11, wherein the first group of vias and the second group of vias individually comprise at least three vias.

13. The semiconductor manufacturing method according to claim 10, wherein the wiring layer is a dielectric layer and the conducting wire is a strip line.

14. The semiconductor manufacturing method according to claim 10, wherein step (A) further comprises:
    (A1) forming a first dielectric layer and a first signal circuit to constitute the first signal layer; and
    (A2) forming a second dielectric layer and a second signal circuit to constitute the second signal layer;
    wherein the first signal circuit is disposed between the first dielectric layer and the wiring layer, and the second signal circuit is disposed between the second dielectric layer and the wiring layer.

15. The semiconductor manufacturing method according to claim 14, wherein the first signal layer and the second signal layer have the same potential.

16. The semiconductor manufacturing method according to claim 15, wherein the first group of vias and the second group of vias are for short-circuiting the first signal layer and the second signal layer.

17. The semiconductor manufacturing method according to claim 16, wherein each of the first group of vias and each of the second group of vias comprises a conductive material for short-circuiting the first signal layer and the second signal layer.

18. The semiconductor manufacturing method according to claim 16, wherein each of the first group of vias and each of the second group of vias comprises a pillar for short-circuiting the first signal layer and the second signal layer.

19. The semiconductor manufacturing method according to claim 10, wherein step (C) further comprises:
   disposing a first pillar and a second pillar on the first terminal and the second terminal respectively, the first pillar is disposed between the first signal layer and the wiring layer, and the second pillar is disposed between the second signal layer and the wiring layer.

20. A semiconductor structure, comprising:
   a first signal layer;
   a second signal layer;
   a wiring layer formed between the first signal layer and the second signal layer, wherein a conducting wire is disposed between a first terminal and a second terminal on the wiring layer; and
   a first group of vias and a second group of vias for conducting the first signal layer and the second signal layer;
   wherein the distance between each via of the first group of vias and the first terminal is substantially the same, and the distance between each via of the second group of vias and the second terminal is substantially the same;
   wherein the distance between each via of the first group of vias and each via of the second group of vias being substantially equal to or larger than the length of the conducting wire;
   wherein each via of the first group of vias is disposed adjacent to the first terminal and each via of the second group of vias is disposed adjacent to the second terminal.

* * * * *